United States Patent
Labonte et al.

(10) Patent No.: US 9,478,662 B2
(45) Date of Patent: Oct. 25, 2016

(54) GATE AND SOURCE/DRAIN CONTACT STRUCTURES FOR A SEMICONDUCTOR DEVICE

(71) Applicant: GLOBALFOUNDRIES Inc., Grand Cayman (KY)

(72) Inventors: Andre Labonte, Mechanicville, NY (US); Ruilong Xie, Niskayuna, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/063,604

(22) Filed: Mar. 8, 2016

(65) Prior Publication Data

US 2016/0268415 A1   Sep. 15, 2016

Related U.S. Application Data

(62) Division of application No. 14/641,551, filed on Mar. 9, 2015, now Pat. No. 9,324,656.

(51) Int. Cl.
| | |
|---|---|
| *H01L 23/02* | (2006.01) |
| *H01L 29/78* | (2006.01) |
| *H01L 29/45* | (2006.01) |

(52) U.S. Cl.
CPC ............. *H01L 29/785* (2013.01); *H01L 29/45* (2013.01)

(58) Field of Classification Search
CPC .................. H01L 21/76895; H01L 21/76805; H01L 21/76831; H01L 21/76877; H01L 23/535
USPC ......................................................... 257/656
See application file for complete search history.

(56) References Cited

U.S. PATENT DOCUMENTS

| | | | |
|---|---|---|---|
| 7,915,693 B2 | 3/2011 | Okano | |
| 8,772,109 B2 | 7/2014 | Colinge | |
| 8,921,218 B2 | 12/2014 | Yang et al. | |
| 9,054,172 B2 | 6/2015 | Hung et al. | |
| 9,112,031 B2 | 8/2015 | Leobandung | |
| 9,117,908 B2 | 8/2015 | Xie et al. | |
| 9,166,010 B2 | 10/2015 | Kelly et al. | |
| 9,324,656 B1 * | 4/2016 | Labonte | H01L 23/535 |
| 2012/0273899 A1 | 11/2012 | Wann et al. | |
| 2013/0187228 A1 | 7/2013 | Xie et al. | |
| 2015/0091100 A1 | 4/2015 | Xie et al. | |

* cited by examiner

*Primary Examiner* — Michael Lebentritt
(74) *Attorney, Agent, or Firm* — Amerson Law Firm, PLLC

(57) ABSTRACT

One illustrative device disclosed herein includes, among other things, a dielectric layer disposed above a source/drain region and a gate structure of a transistor, a first conductive contact positioned in the dielectric layer and contacting the gate structure, wherein a first spacer is disposed on a sidewall of the first conductive contact, and a second conductive contact positioned in the dielectric layer and contacting the source/drain region, wherein the first spacer at least partially defines a spacing between the first conductive contact and the second conductive contact.

19 Claims, 18 Drawing Sheets

GATE AND SOURCE/DRAIN CONTACT STRUCTURES FOR A SEMICONDUCTOR DEVICE

BACKGROUND OF THE INVENTION

1. Field of the Invention

The present disclosure generally relates to the fabrication of integrated circuits, and, more particularly, to various methods of forming contacts on semiconductor devices and the resulting gate and source/drain contact structures on such semiconductor devices.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

FIG. 1 is a perspective view of an illustrative prior art FinFET semiconductor device 100 that is formed above a semiconductor substrate 105 at an intermediate point during fabrication. In this example, the FinFET device 100 includes three illustrative fins 110, a gate structure 115, sidewall spacers 120, a gate cap layer 125, and an isolation material 130. The fins 110 have a three-dimensional configuration: a height, a width, and an axial length. The portions of the fins 110 covered by the gate structure 115 are the channel regions of the FinFET device 100, while the portions of the fins 110 positioned laterally outside of the spacers 120 are part of the source/drain regions of the device 100. Although not depicted, the portions of the fins 110 in the source/drain regions may have additional epi semiconductor material formed thereon in either a merged or unmerged condition.

Over recent years, due to the reduced dimensions of the transistor devices, the operating speed of the circuit components has been increased with every new device generation, and the "packing density," i.e., the number of transistor devices per unit area, in such products has also increased during that time. Such improvements in the performance of transistor devices has reached the point where one limiting factor relating to the operating speed of the final integrated circuit product is no longer the individual transistor element but the electrical performance of the complex wiring system that is formed above the device level that includes the actual semiconductor-based circuit elements. Typically, due to the large number of circuit elements and the required complex layout of modern integrated circuits, the electrical connections of the individual circuit elements cannot be established within the same device level on which the circuit elements are manufactured, but require one or more additional metallization layers, which generally include metal-containing lines providing the intra-level electrical connection, and also include a plurality of inter-level connections or vertical connections, which are also referred to as vias. These vertical interconnect structures comprise an appropriate metal and provide the electrical connection of the various stacked metallization layers.

Furthermore, in order to actually connect the circuit elements formed in the semiconductor material with the metallization layers, an appropriate vertical contact structure is provided, a first end of which is connected to a respective contact region of a circuit element, such as a gate electrode and/or the drain and source regions of transistors, and a second end that is connected to a respective metal line in the metallization layer by a conductive via. In some applications, the second end of the contact structure may be connected to a contact region of a further semiconductor-based circuit element, in which case the interconnect structure in the contact level is also referred to as a local interconnect. The contact structure may comprise contact elements or contact plugs having a generally square-like or round shape that are formed in an interlayer dielectric material, which in turn encloses and passivates the circuit elements. As the critical dimensions of the circuit elements in the device level decreased, the dimensions of metal lines, vias and contact elements were also reduced. In some cases, the increased packing density mandated the use of sophisticated metal-containing materials and dielectric materials in order to reduce the parasitic capacitance in the metallization layers and provide a sufficiently high conductivity of the individual metal lines and vias. For example, in complex metallization systems, copper in combination with low-k dielectric materials, which are to be understood as dielectric materials having a dielectric constant of approximately 3.0 or less, are typically used in order to achieve the required electrical performance and the electromigration behavior as is required in view of reliability of the integrated circuits. Consequently, in lower-lying metallization levels, metal lines and vias having critical dimensions of approximately 100 nm and significantly less may have to be provided in order to achieve the required packing density in accordance with density of circuit elements in the device level.

As device dimensions have decreased, the conductive contact elements in the contact level have to be provided with critical dimensions in the same order of magnitude. The contact elements typically represent plugs or line-type features, which are formed of an appropriate metal or metal composition, wherein, in sophisticated semiconductor devices, tungsten, in combination with appropriate barrier materials, has proven to be a viable contact metal. When forming tungsten-based contact elements, typically the interlayer dielectric material is formed first and is patterned so as to receive contact openings, which extend through the interlayer dielectric material to the corresponding contact areas of the circuit elements. In particular, in densely packed device regions, the lateral size of the drain and source areas, which defines the available area for the contact regions, may be about 100 nm and significantly less, thereby requiring extremely complex lithography and etch techniques in order to form the contact openings with well-defined lateral dimensions and with a high degree of alignment accuracy.

FIG. 2 is a simplistic plan view of an illustrative prior art FinFET device 200 that will be referenced to discuss one particular problem as it relates to the formation of contact structures on a FinFET device. In general, the FinFET device 200 is formed above an active region 205 that is defined in a semiconductor substrate by an isolation structure (not shown), such as a shallow trench isolation structure. In the depicted example, the FinFET device 200 is comprised of three illustrative fins 210 and an illustrative gate structure 215. A sidewall spacer 215A and a gate cap layer 215B may be formed so as to encapsulate the gate structure 215. The fins 210 may be either merged on unmerged. In the depicted example, the fins 210 are unmerged. The portions of the fins 210 positioned laterally outside of the spacers 215A constitute the source/drain (S/D) regions of the device 200. Also depicted are illustrative source/drain contact structures 220 (which are line-type structures that are sometimes referred to as "trench silicide" or "TS" or "CA" structures) and a gate contact structure 225 (which is sometimes referred to as a "CB" structure). The source/drain contact structures 220 may be formed as a line-type structure to ensure, to the extent possible, good contact is achieved with all of the exterior surfaces of all of the fins 210, even when assuming a "worst-case" misalignment scenario. The line-type source/drain contact structures 220 extend across the entire width 230 of the active region 205 in the gate-width direction 230 of the device 200. The space 235 between the gate contact structure 225 and the source/drain contact structures 220 must be large enough such that a short circuit cannot form between the gate contact structure 225 and one of the line-type source/drain contact structures 220. In current day devices, the distance 235 may be very small, and accordingly, the distance 240 between the active region 205 and the gate contact structure 225 may be set to be about 30-60 nm. One way to ensure that such a short circuit is not created would be to simply increase the distance 240, i.e., position the gate contact structure 225 farther away from the ends of line-type source/drain contact structures 220. Unfortunately, given the drive to ever increase packing densities, such a solution would undesirably increase the "foot-print" of the device 200, thereby resulting in an undesirable area consumption penalty.

The present disclosure is directed to various methods of forming contacts on FinFET semiconductor devices, and the resulting semiconductor devices, that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming contacts on semiconductor devices, and the resulting semiconductor devices. One method of forming a transistor device comprised of a source/drain region and a gate structure includes forming a dielectric layer above the source/drain region and the gate structure. A first opening is formed in at least the dielectric layer to expose the gate structure. A first spacer is formed on sidewalls of the first opening. After forming the first spacer in the first opening, a second opening is formed in at least the dielectric later to expose a portion of the source/drain region. The first spacer at least partially defines a spacing between the first opening and the second opening. A conductive gate contact is formed in the first opening and a conductive source/drain contact is formed in the second opening.

Another illustrative method disclosed herein includes, among other things, forming a dielectric layer above a gate electrode and a source/drain region. A first opening is formed in at least the dielectric layer to expose the gate electrode. A first spacer is formed on sidewalls of the first opening. A second opening is formed in at least the dielectric layer to expose the source/drain region. The first spacer at least partially defines a spacing between the first opening and the second opening. A first conductive contact is formed in the first opening and a second conductive contact is formed in the second opening.

One illustrative device disclosed herein includes, among other things, a substrate, a source/drain region defined in the substrate and a gate structure. A dielectric layer is disposed above the source/drain region and the gate structure. A first conductive contact is positioned in the dielectric layer and contacts the gate structure. A first spacer is disposed on a sidewall of the first conductive contact. A second conductive contact is positioned in the dielectric layer and contacts the source/drain region. The first spacer at least partially defines a spacing between the first conductive contact and the second conductive contact.

BRIEF DESCRIPTION OF THE DRAWINGS

The disclosure may be understood by reference to the following description taken in conjunction with the accompanying drawings, in which like reference numerals identify like elements, and in which.

Figure 1:
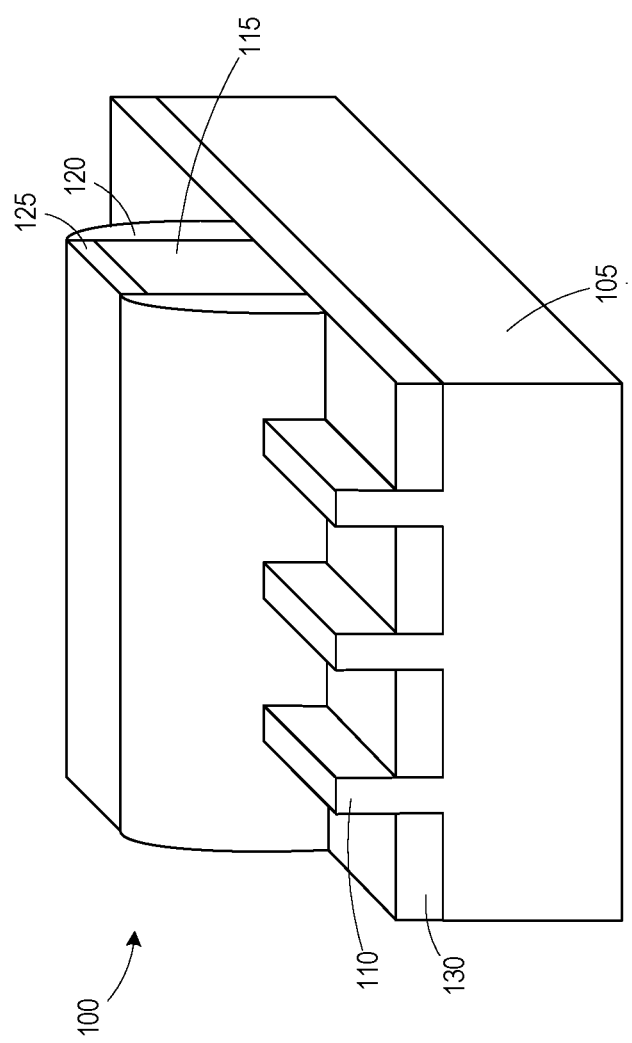
FIG. 1 is a perspective view of one illustrative embodiment of a prior art FinFET device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming contacts on FinFET semiconductor devices and the resulting semiconductor devices. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. As will be appreciated by those skilled in the art after a complete reading of the present application, the inventions disclosed herein may be employed in forming integrated circuit products using a variety of so-called 3D devices, such as FinFETs. For purposes of disclosure, reference will be made to an illustrative process flow wherein a single FinFET device 300 is formed. Moreover, the inventions will be disclosed in the context of forming the gate structures using a replacement gate ("gate-last") processing technique. However, the methods, structures and products disclosed herein may be employed where the gate structures of the transistors are formed using so-called "gate-first" processing techniques. Thus, the inventions disclosed herein should not be considered to be limited to the illustrative examples depicted and described herein. With reference to the attached figures, various illustrative embodiments of the methods and devices disclosed herein will now be described in more detail.

FIGS. 3A-3K depict one illustrative method disclosed for forming contacts for FinFET semiconductor devices and the resulting semiconductor devices. The illustrative device 300 is formed in and above a semiconductor substrate 305. The device 300 may be either an NMOS or a PMOS transistor or a combination thereof with a shared gate structure. Additionally, various doped regions, e.g., source/drain regions, halo implant regions, well regions and the like, are also not depicted in the attached drawings. The substrate 305 may have a variety of configurations, such as the depicted bulk silicon configuration. The substrate 305 may also have a silicon-on-insulator (SOI) configuration that includes a bulk silicon layer, a buried insulation layer and an active layer, wherein semiconductor devices are formed in and above the active layer. The substrate 305 may be made of silicon or it may be made of materials other than silicon. Thus, the terms "substrate" or "semiconductor substrate" should be understood to cover all semiconducting materials and all forms of such materials.

FIGS. 3A-3J also include a simplistic plan view of the device 300 (in the upper right corner) that depicts the location where various cross-sectional views depicted in the following drawings will be taken. More specifically, the view "X-X" is taken along the long axis of a gate structure of the device 300 (i.e., in the gate width direction of the device), and the view "Y-Y" is a cross-sectional view that is taken through the source/drain region of the device in a direction that is transverse to the long axis of the fins or parallel to the gate width direction of the device.

Figure 3A:
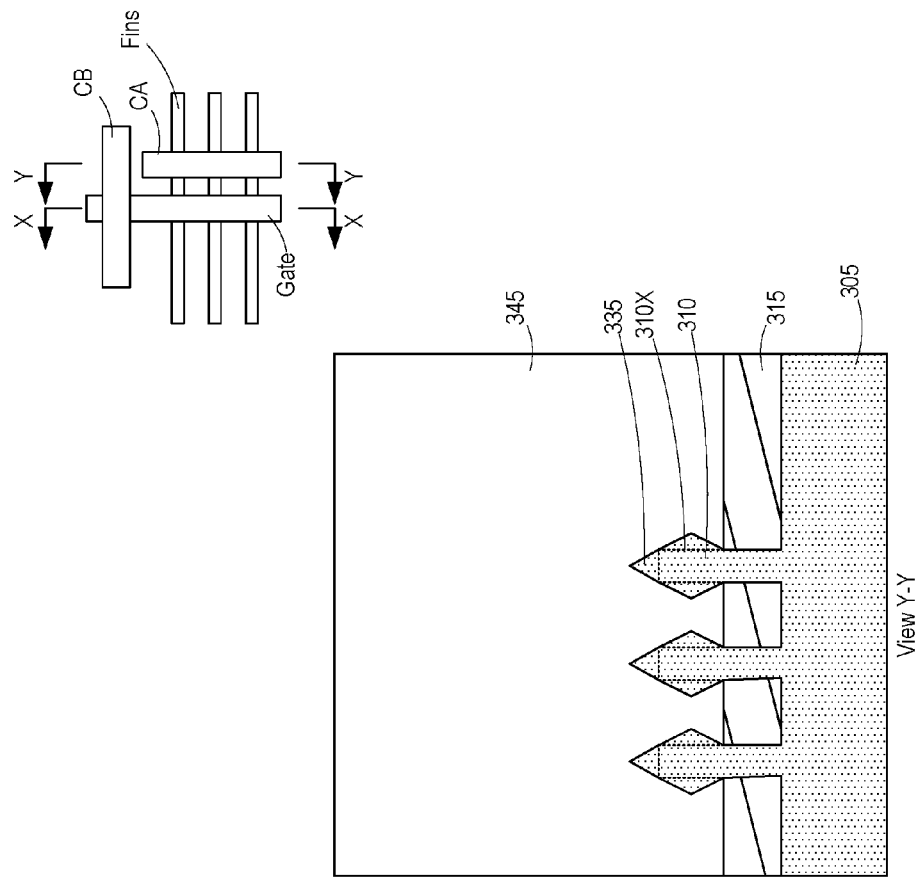
FIGS. 3A-3K depict one illustrative method disclosed for forming contacts on FinFET semiconductor devices and the resulting semiconductor devices.
Figure 3A:
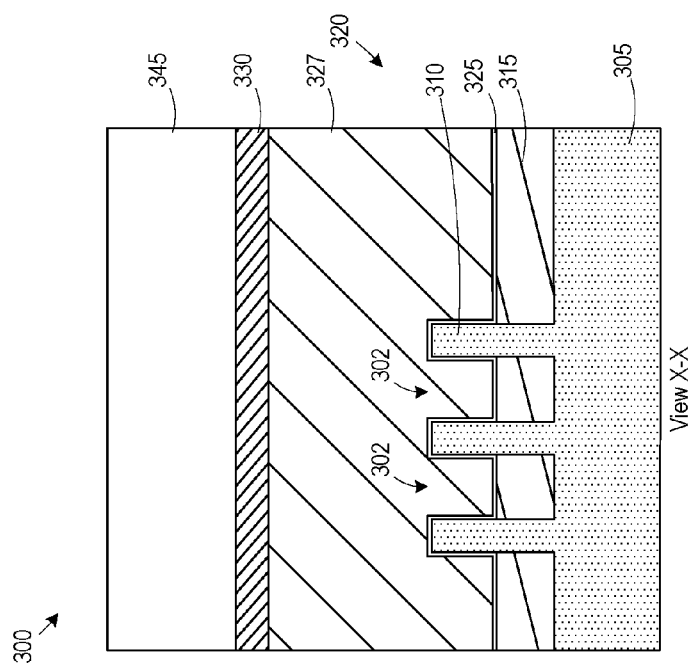

FIG. 3A depicts the device 300 at a point in fabrication wherein several process operations have been performed. First, a plurality of trenches 302 were formed in the substrate 305 to thereby define a plurality of fins 310. The illustrative FinFET device 300 disclosed herein will be depicted as being comprised of three illustrative fins 310. However, as will be recognized by those skilled in the art after a complete reading of the present application, the methods and devices disclosed herein may be employed when manufacturing FinFET devices having any number of fins. Although the illustrative example includes forming contacts for a FinFET transistor device, it may also be applied to other devices, such as planar transistor devices, or other devices.

Next, a recessed layer of insulating material 315 (e.g., silicon dioxide) was formed between the fins 310 to serve as an isolation structure. A gate structure 320 was then formed above a section of the fins 310 to define a channel region of the device 300. The gate structure 320 includes a gate insulation layer 325 (e.g., a layer of high-k insulating material or silicon dioxide), and one or more conductive material layers (e.g., metal and/or polysilicon) that serve as the gate electrode 327 for the device 100. The gate structure 320 may be formed using a replacement gate or "gate-last" technique (e.g., where a placeholder material is replaced with a metal gate electrode) or a "gate-first" technique (e.g., where the gate insulation layer and a gate electrode material, such as doped polysilicon, are deposited in a stack and patterned). Also depicted is an illustrative gate cap layer 330 (e.g., silicon nitride) formed above the gate structure 320.

In the illustrated embodiment, an optional epitaxial growth process was performed to form additional epitaxial semiconductor material 335 (e.g., silicon or silicon germanium) on the exposed surfaces of the fins 310 extending above the isolation structure 315 in the source/drain regions of the device 300. The generally diamond-shaped nature of the epitaxial semiconductor material 335 (see view Y-Y) results from the particular characteristics of the epitaxial growth process and the orientation of the crystallographic planes in the substrate 305. A dashed-line 310X reflects the outline of the original fins 310 in the source/drain regions of the device 300. The epitaxial growth process is typically performed to increase the size of the material to which a conductive contact will later be formed. In some cases, if desired, a so-called fin-merger epitaxial growth process is performed such that the epitaxial material grown on one fin 310 merges into the epitaxial material grown on an adjacent fin. Such merged fins are not depicted in the drawings. An interlayer dielectric (ILD) layer 345 is formed above the device 300 as part of a metallization system for establishing electrical contacts to the source/drain regions with the device 300.

Figure 3B:
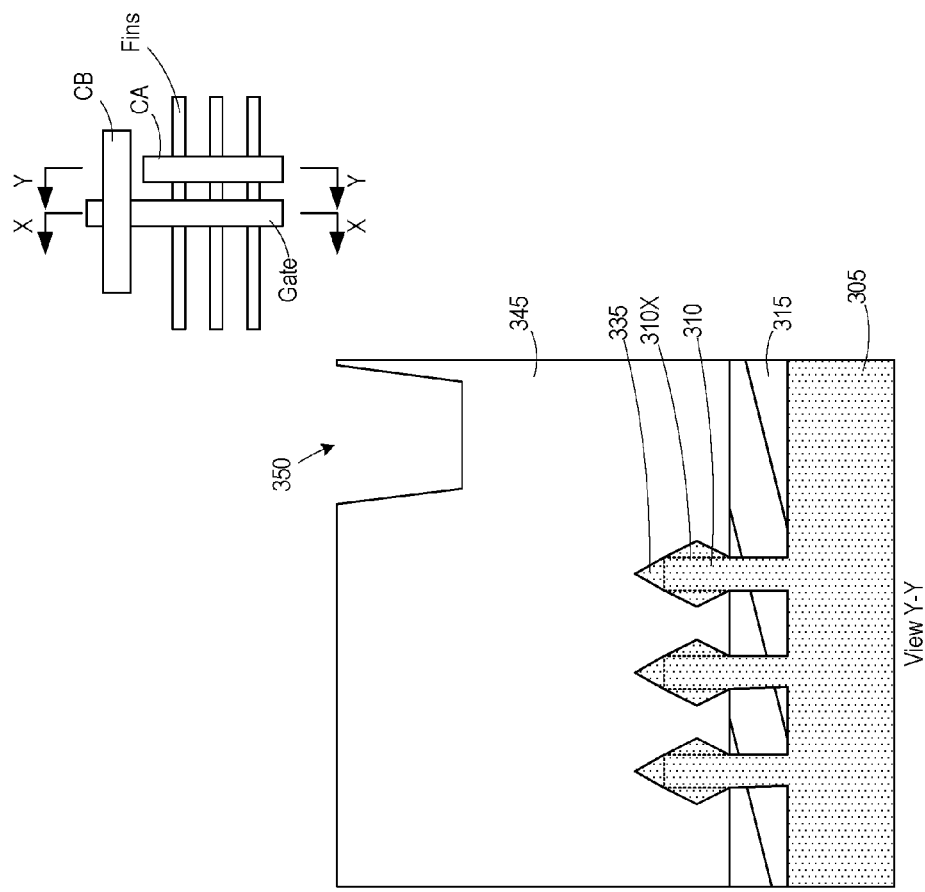
Figure 3B:
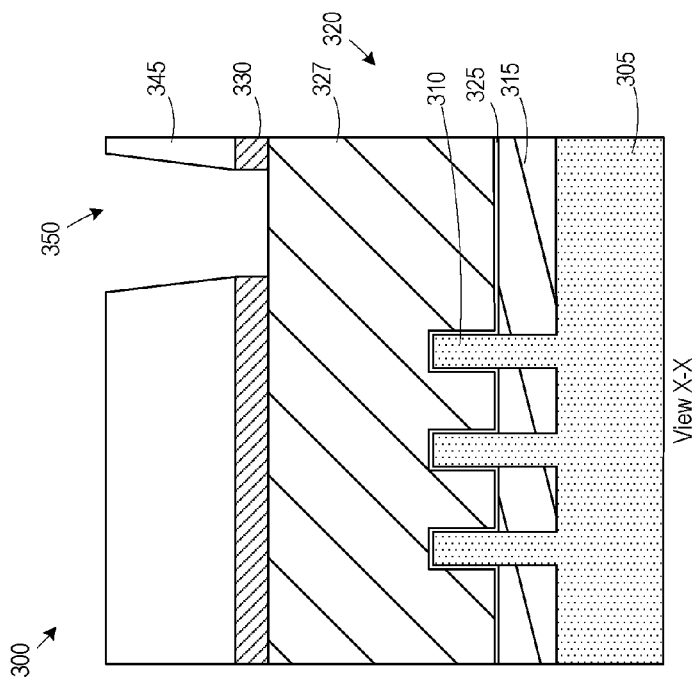

FIG. 3B depicts the device 300 after several etch processes were performed. A masked etch process was performed through a patterned etch mask (not shown) to define a gate contact opening 350 in the ILD layer 345 above the gate structure 320. The masked etch process was terminated on the gate cap layer 330 and terminates within the ILD layer 345 above the source/drain regions of the device 300. One or more additional etch processes were performed to remove the portions of the gate cap layer 330 exposed by the gate contact opening 350 to thereby extend the gate contact opening 350 to expose the gate electrode 327. Additionally, unless specifically noted otherwise, no attempt is made to show the various processing steps discussed herein in the simplistic plan views depicted in the drawings.

Figure 3C:
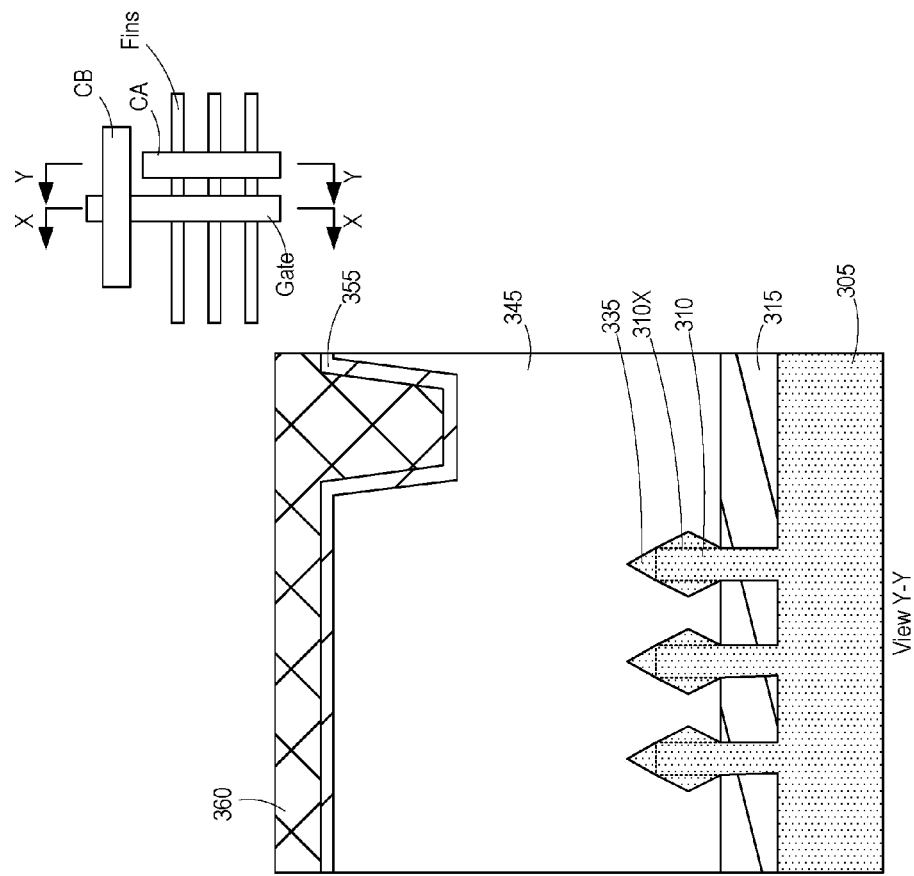
Figure 3C:
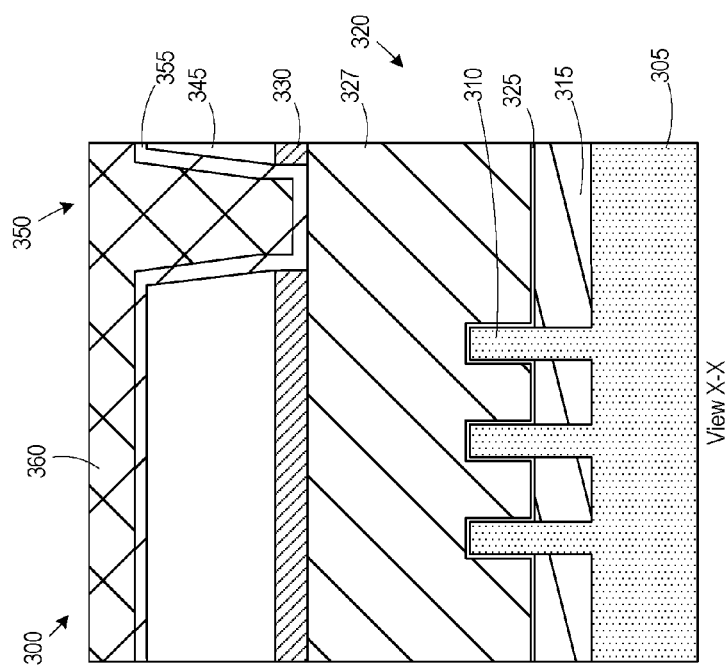

FIG. 3C illustrates the device 300 after a first deposition process was performed to form a spacer layer 355 in the gate contact opening 350 and a second deposition process was performed to form a sacrificial layer 360 (e.g., amorphous silicon or aluminum oxide) above the spacer layer 355.

Figure 3D:
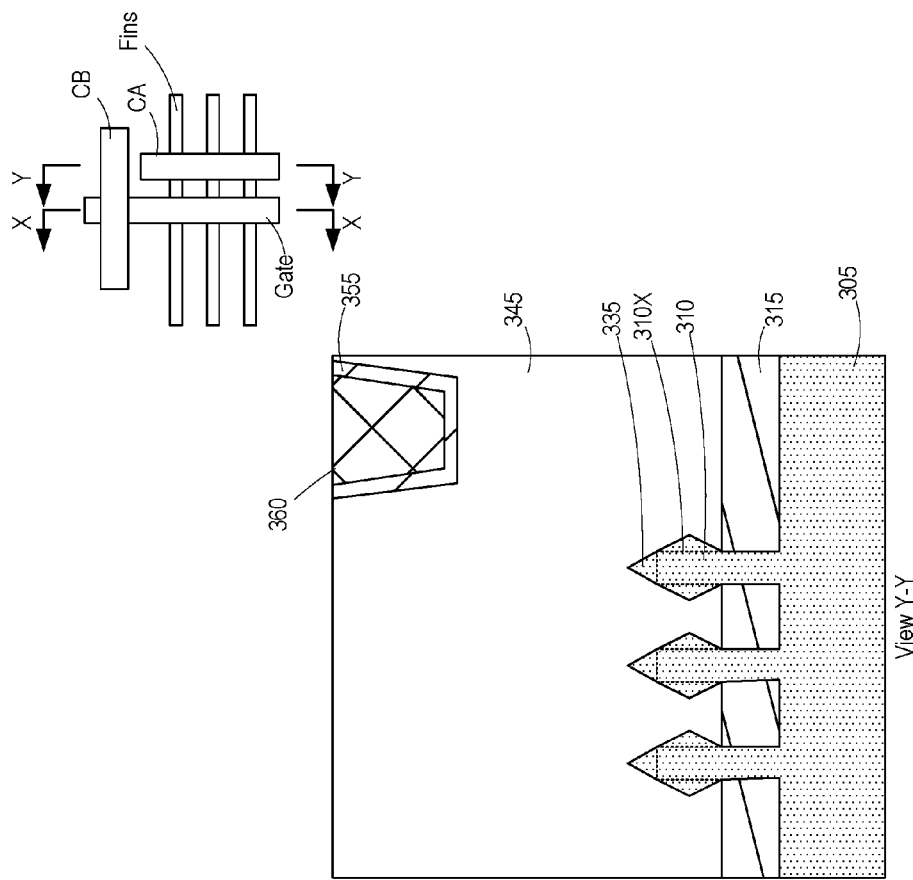
Figure 3D:
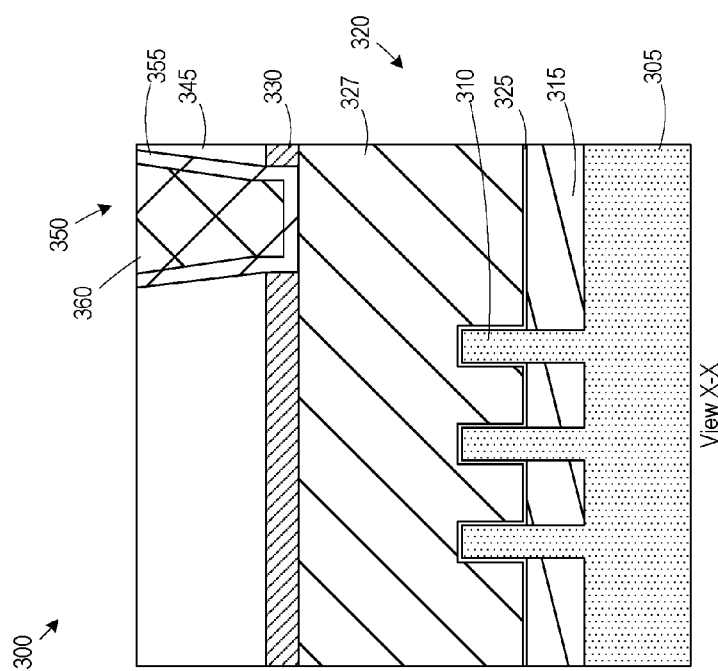

FIG. 3D illustrates the device 300 after a planarizing process, e.g., a CMP process, was performed to remove portions of the spacer layer 355 and the sacrificial layer 360 extending beyond the gate contact opening 350. Eventually, a gate contact structure will be formed in this gate contact opening as described more fully below.

Figure 3E:
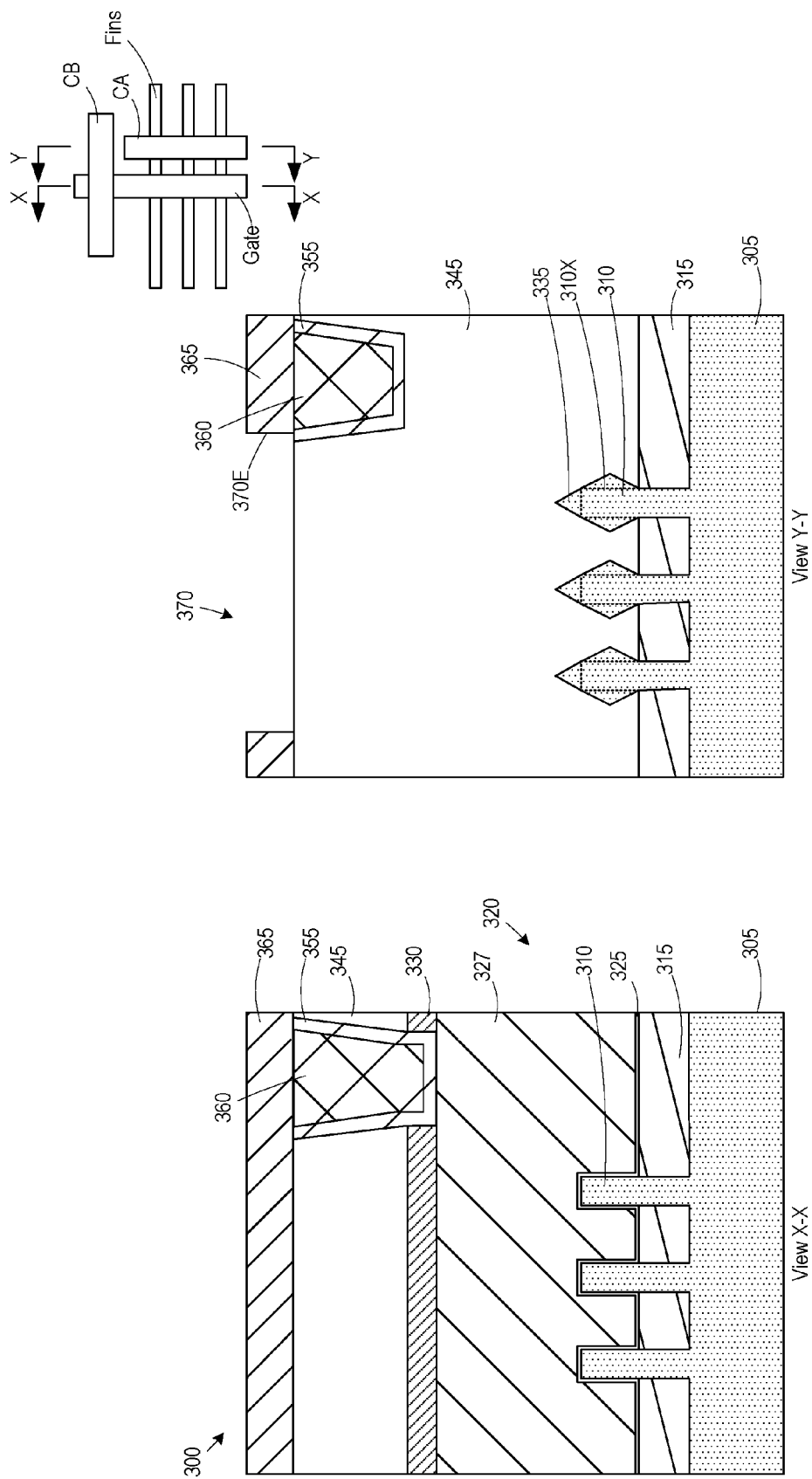

FIG. 3E illustrates the device 300 after a patterned etch mask layer 365 (e.g., organic dielectric material) was formed above the ILD layer 345 and patterned to define an opening 370 above the fins 310 in the source/drain regions. In one embodiment, an edge 370E of the opening 370 is disposed above the spacer layer 355.

Figure 3F:
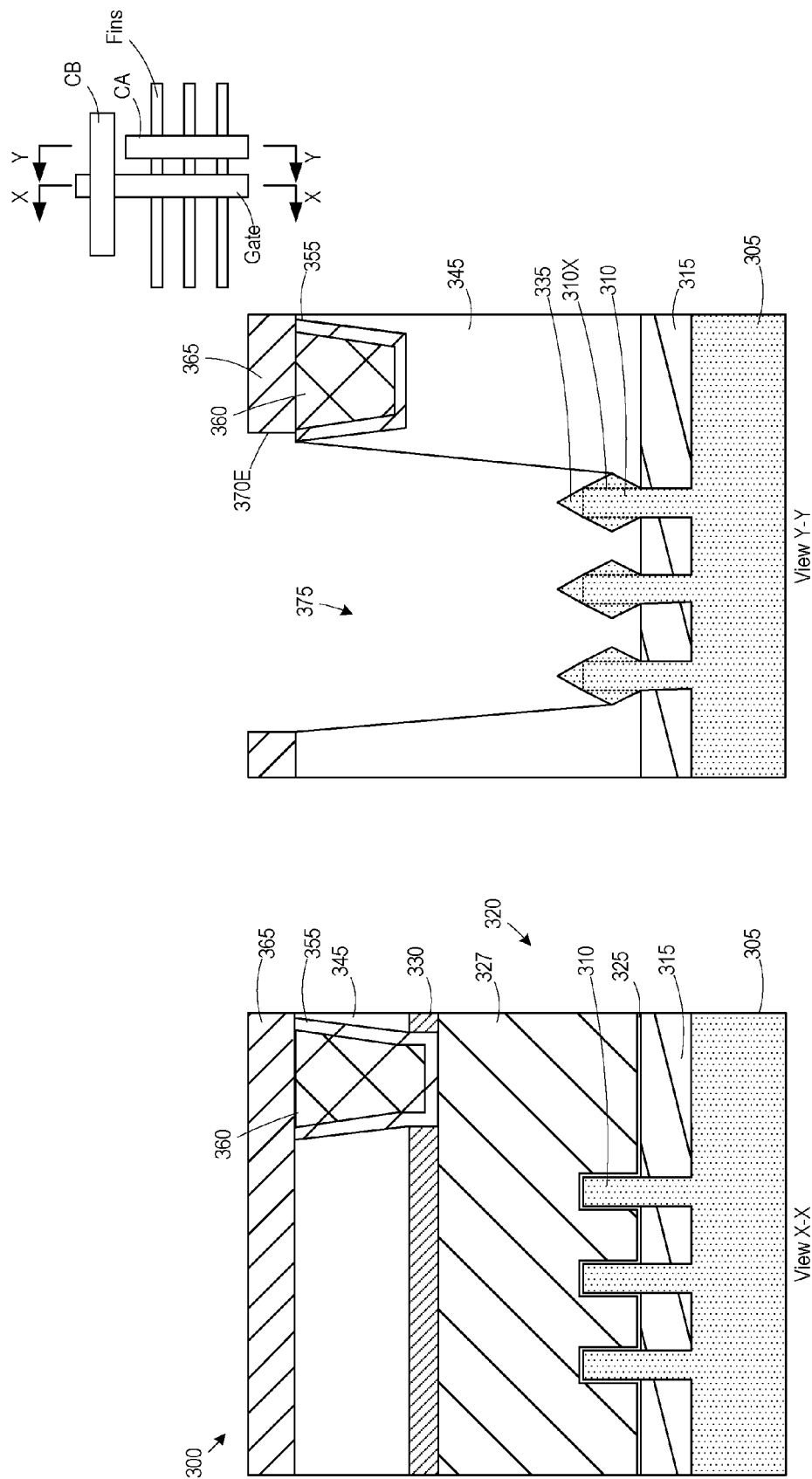

FIG. 3F illustrates the device 300 after a selective etch process was performed to define a fin contact opening 375 in the ILD layer 345. The etch process in FIG. 3F etches oxide, but is selective to SiN and a-Si, such that even if the CA region is overlapped with the CB region due to overlay error, the regions will still be separated by the spacer layer 355. Please note that, if this etch is not selective to spacer and a-Si, CA will still short with CB.

Figure 3G:
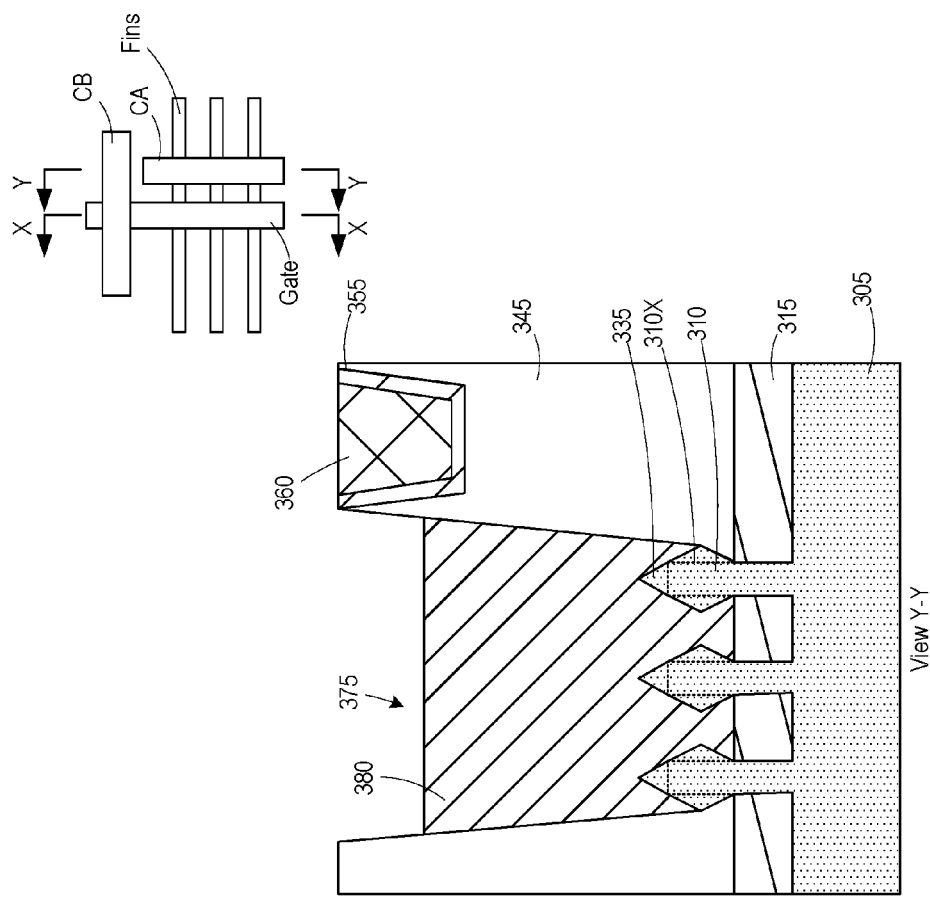
Figure 3G:
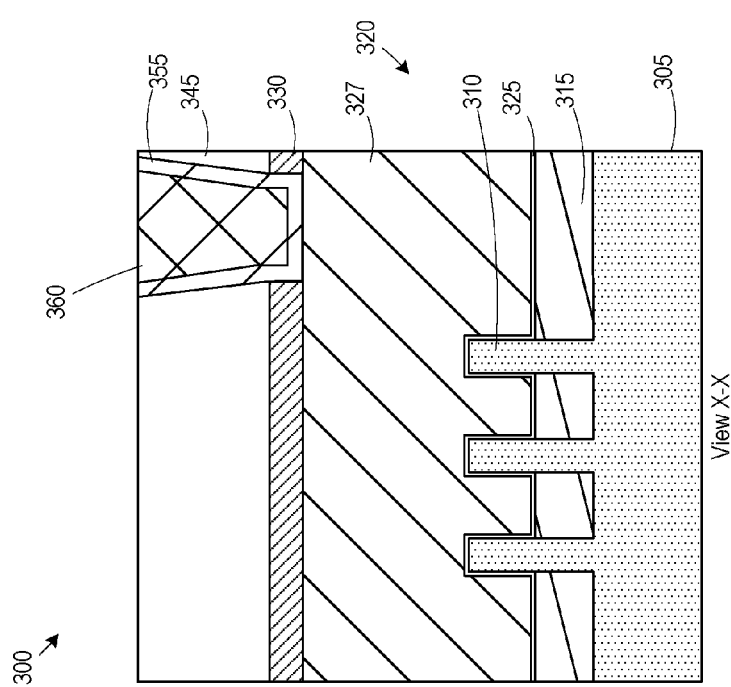

FIG. 3G illustrates the device 300 after several process operations were performed. First, a stripping process was performed to remove the patterned etch mask layer 365. Then, a deposition process was performed to deposit a sacrificial layer 380 (e.g., an organic planarization layer (OPL)). Thereafter, an etch process was performed to recess the sacrificial layer 380 so that it at least partially fills the fin contact opening 375 and does not over-fill the contact opening 375.

Figure 3H:
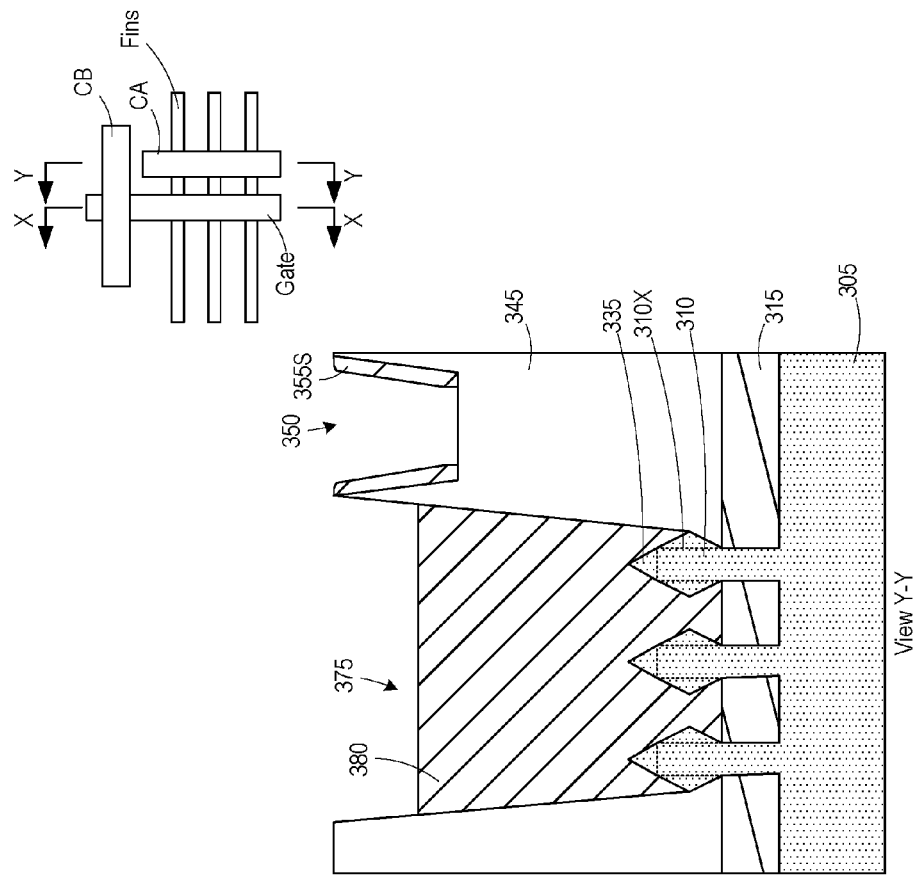
Figure 3H:
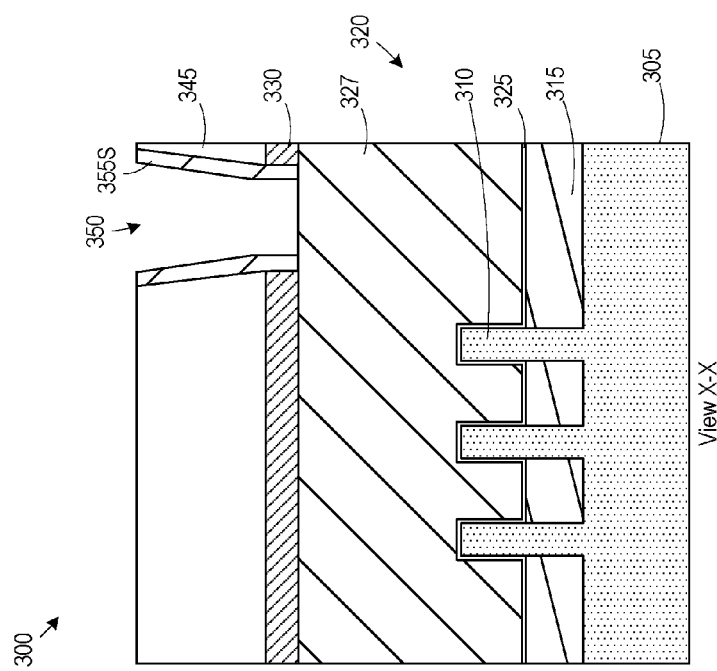

FIG. 3H illustrates the device 300 after a first etch process was performed to remove the sacrificial layer 360 and a second anisotropic etch process was performed on the spacer layer 355 to thereby define a spacer 355S on the sidewalls of the gate contact opening 350.

Figure 3I:
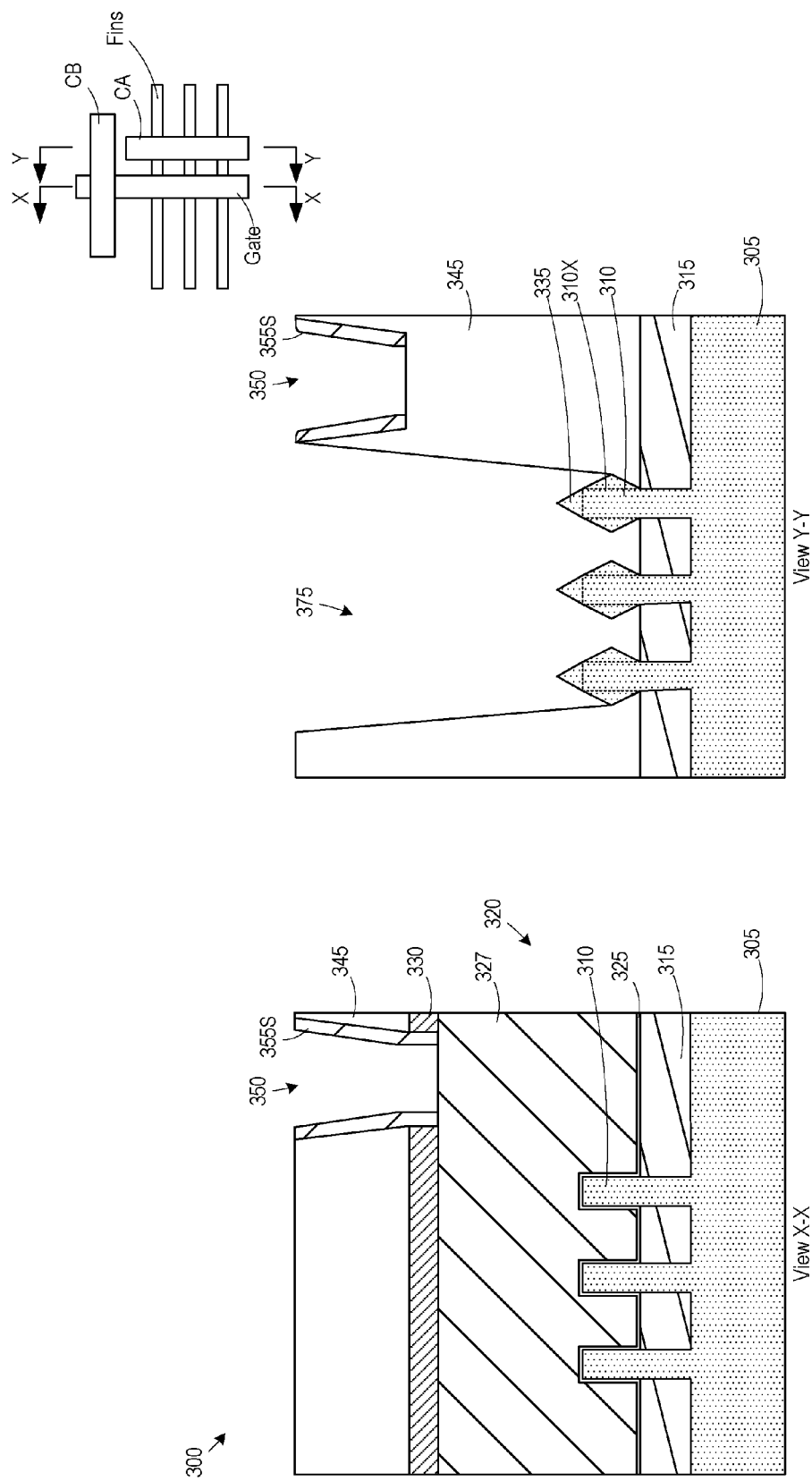

FIG. 3I illustrates the device 300 after a stripping process was performed to remove the sacrificial layer 380.

Figure 3J:
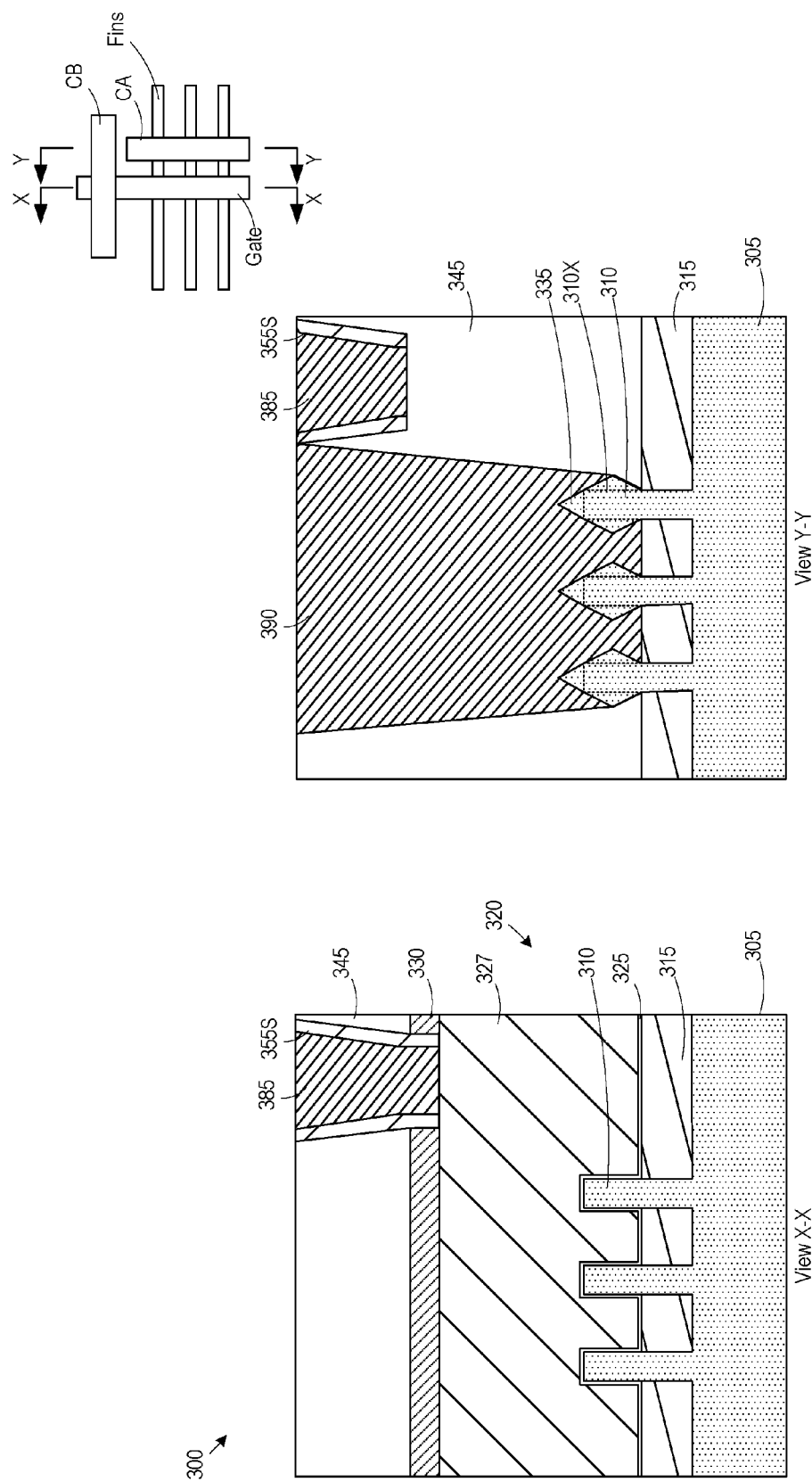

FIG. 3J illustrates the device 300 after a plurality of processes were performed to form a conductive gate contact structure 385 in the gate contact opening 350 and a source/drain contact structure 390 in the fin contact opening 375. The processes may be performed at the same time, i.e., simultaneously, to form the gate contact structure 385 and the source/drain contact structure 390. Such process operations may include performing one or more deposition processes to overfill the contact openings 350, 375 and performing a planarization process to remove conductive material positioned outside of the contact openings 350, 375. The conductive contact structures 385, 390 may include multiple layers, such as one or more barrier layers (e.g., Ta, TaN, TiN, etc.) to prevent migration of any metal (e.g., copper) into the ILD layer 345, a metal seed layer (e.g., copper), a metal fill material (e.g., copper), a metal silicide material, etc., although such additional layers are not separately depicted in the drawings.

Figure 2:
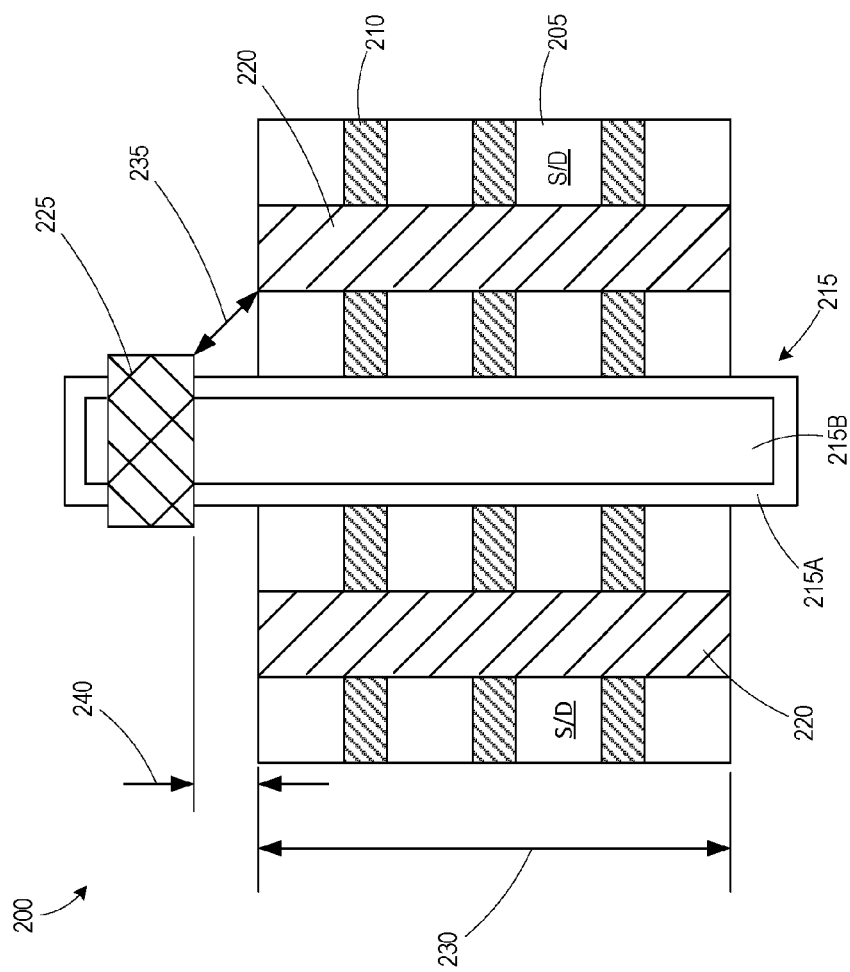
FIG. 2 is a simplistic plan view of one illustrative embodiment of a prior art FinFET device with various contact structures formed on the device.
Figure 3K:
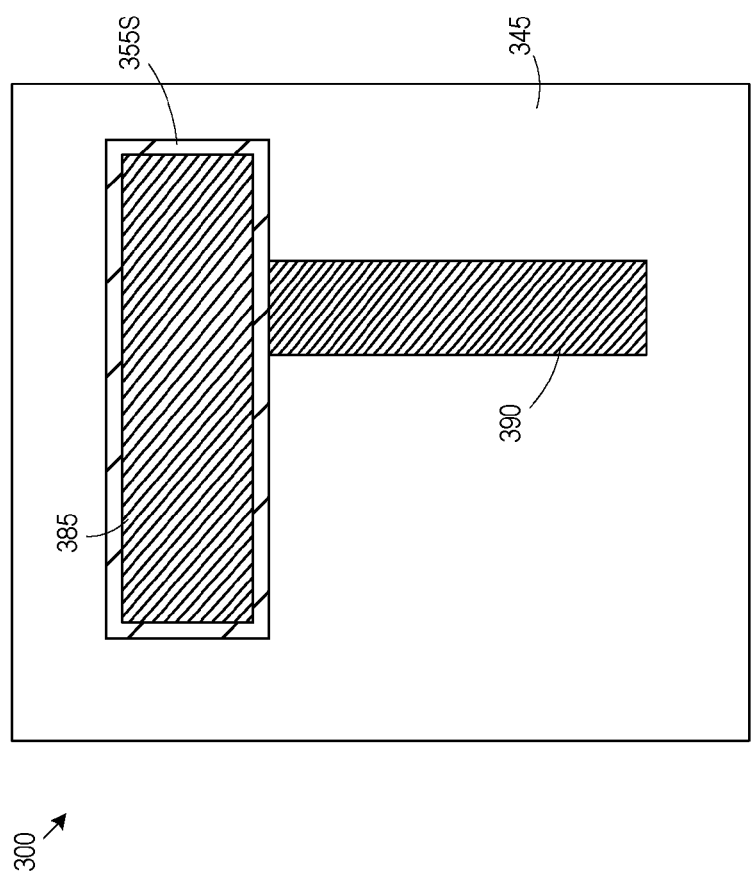

FIG. 3K illustrates a plan view of the device 300. As compared to the arrangement in FIG. 2, the gate conductive contact structure 385 is relatively wider (in the gate length direction) than is the gate contact structure 225 shown in FIG. 2. That is, the wider gate conductive contact structure 385 extends laterally beyond or "overlaps" the outer edges of the source/drain conductive contact structure 390. Due to this relatively wider conductive gate contact structure 385, the spacer 355S contacts both the conductive contact structures 385, 390 (i.e., at least near the top surface of the dielectric layer 345) in a region where the conductive contact structure 385 overlaps the conductive contact structure 390, thereby defining the minimum spacing therebetween and preventing shorts. The width of the spacer 355S may be controlled to control the minimum spacing between the conductive contact structures 385, 390.

Figure 4A:
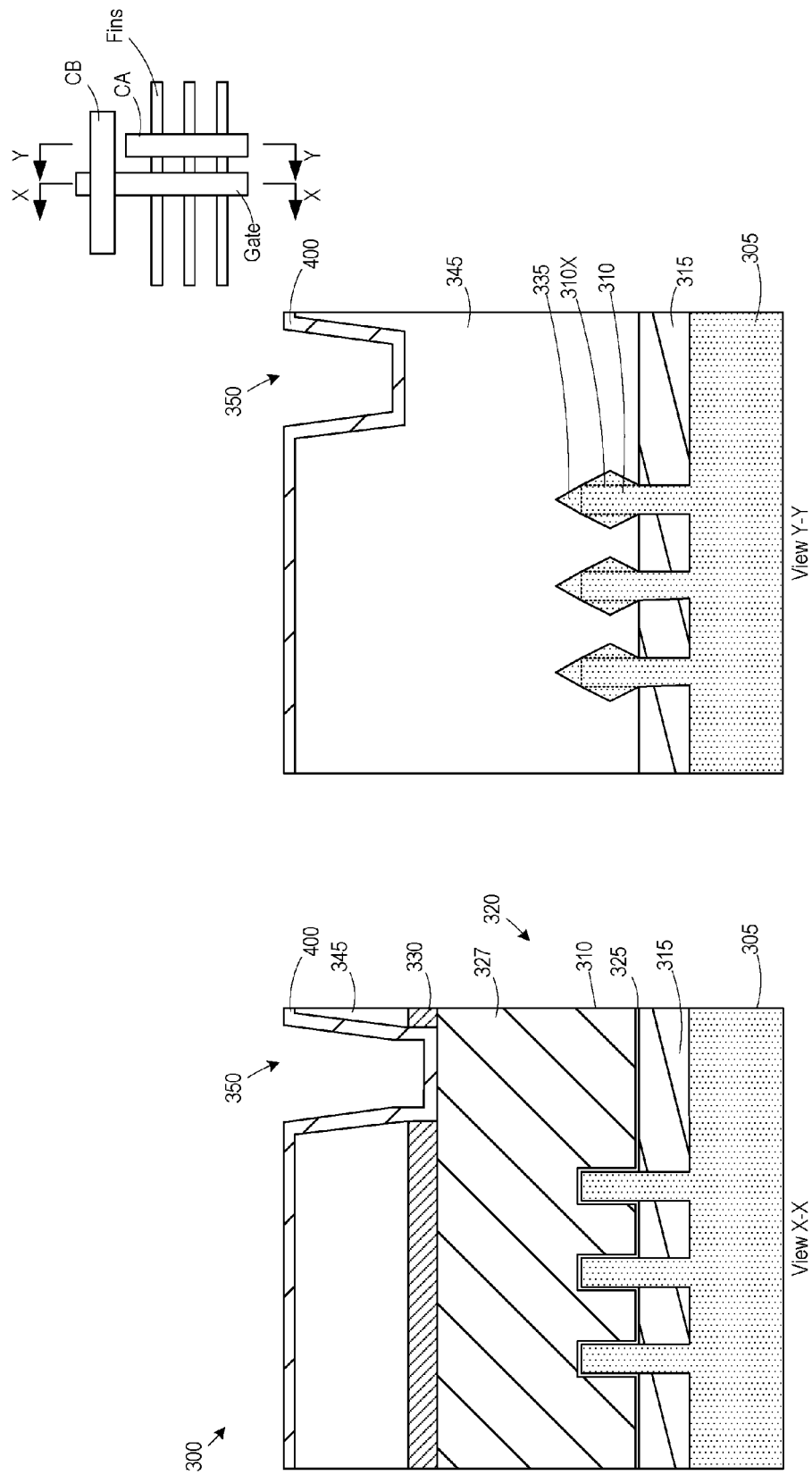
FIGS. 4A-4B depict an alternative process flow for forming contacts on FinFET semiconductor devices and the resulting semiconductor devices.
Figure 4B:
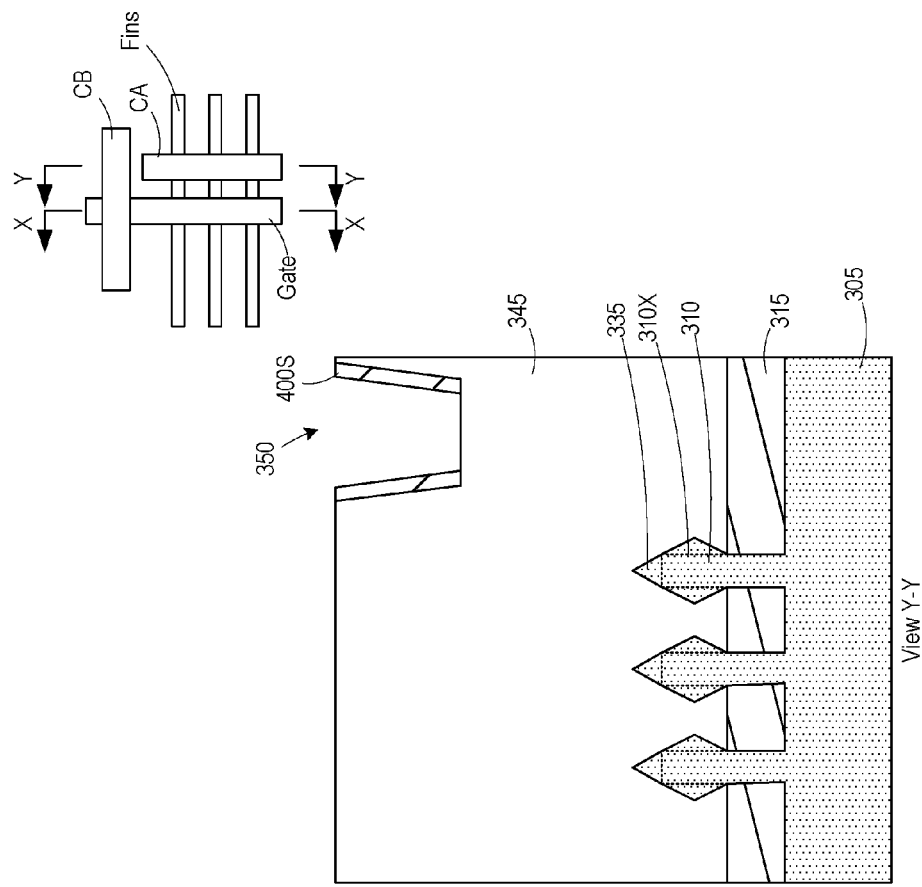
Figure 4B:
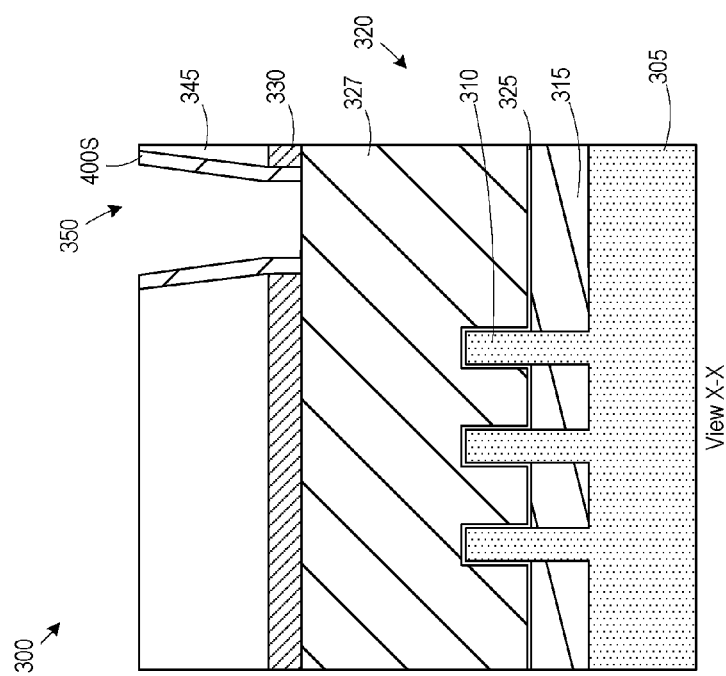

FIGS. 4A-4B illustrate an alternative process flow for forming a spacer in the gate contact opening 350. FIG. 4A illustrates the device 300 after a deposition process was performed on the device 300 illustrated in FIG. 3B to form a spacer layer 400 in the gate contact opening 350.

FIG. 4B illustrates the device 300 after an etch process was performed on the spacer layer 400 to define a sidewall spacer 400S. The processes of FIGS. 3G and 3H may be skipped and the remaining processes may be performed to define the conductive contact structures 385, 390. Similarly, the spacer 400S provides a self-aligned offset between the conductive contact structures 385, 390 thereby preventing shorts.

Figure 5A:
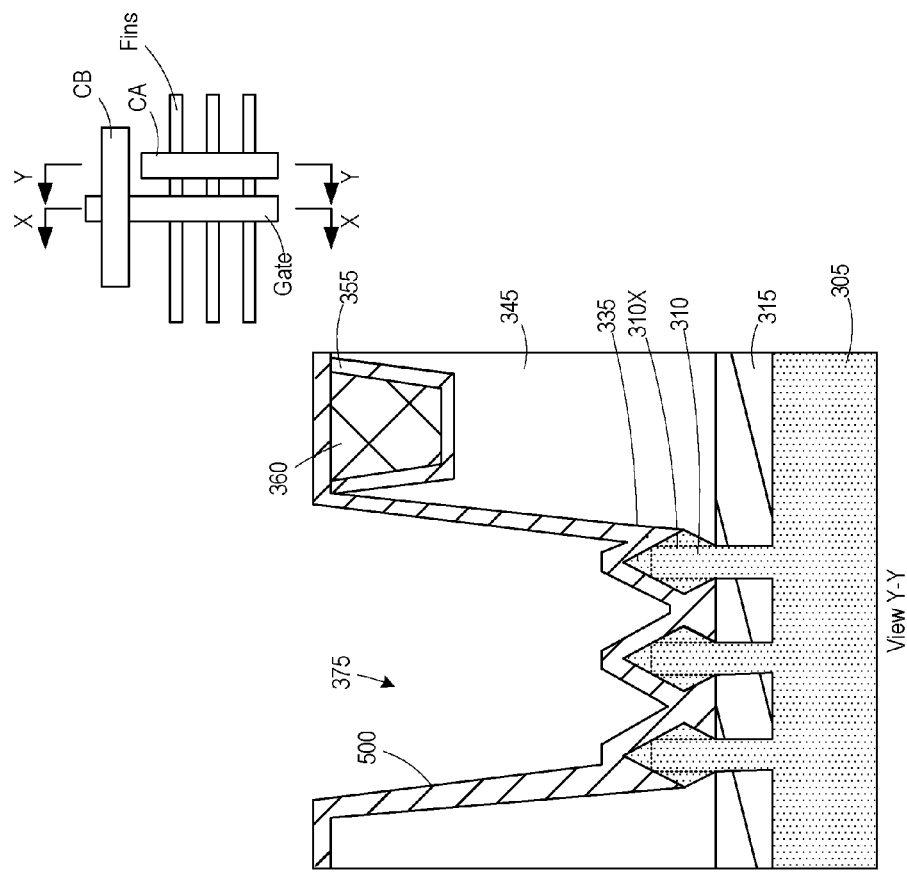
FIGS. 5A-5C depict another alternative process flow for forming contacts on FinFET semiconductor devices and the resulting semiconductor devices.
Figure 5A:
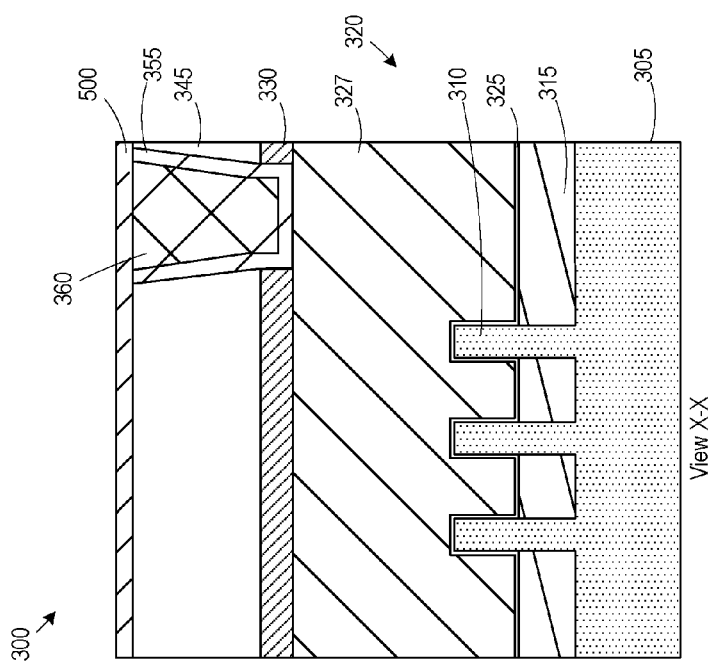
Figure 5B:
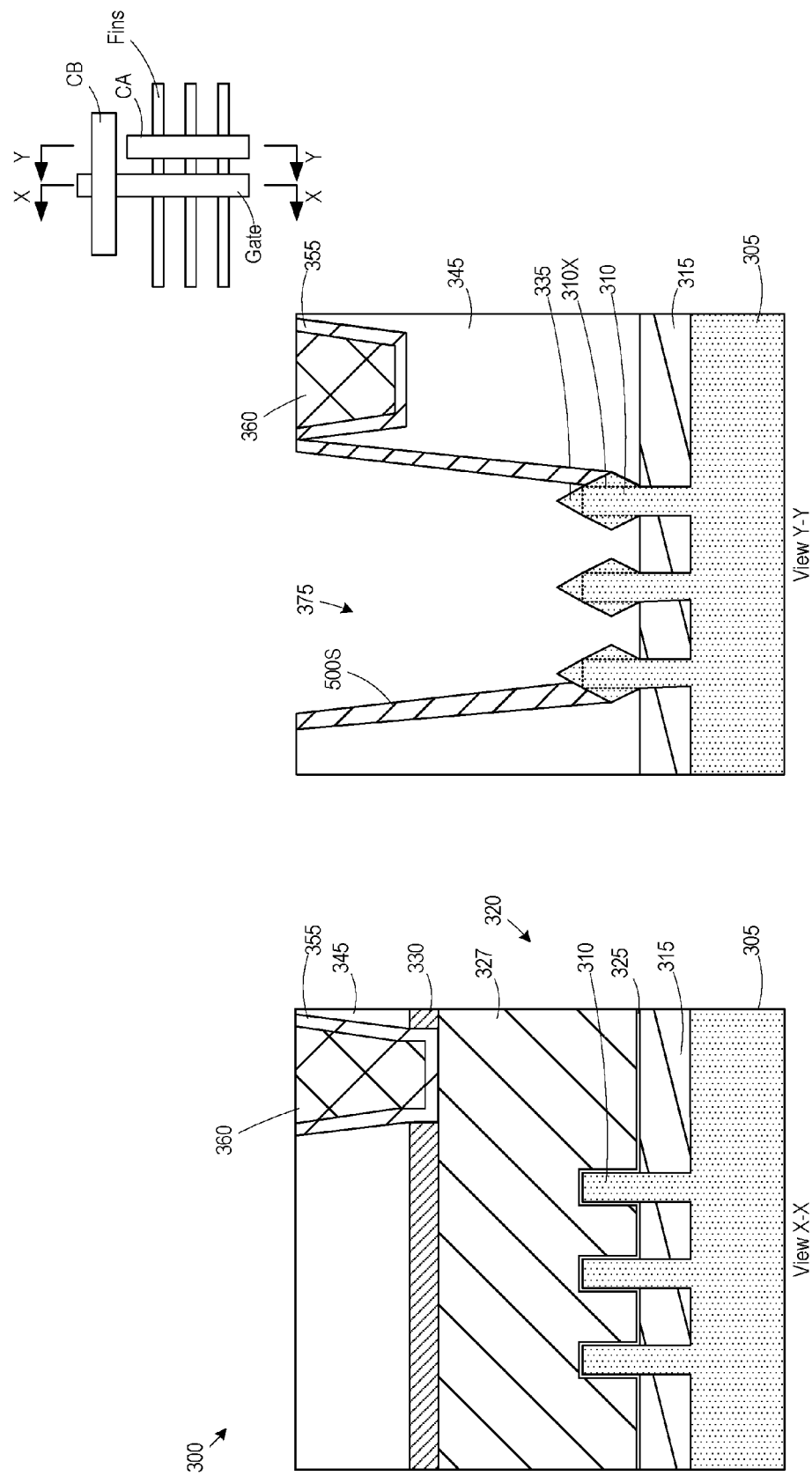
Figure 5C:
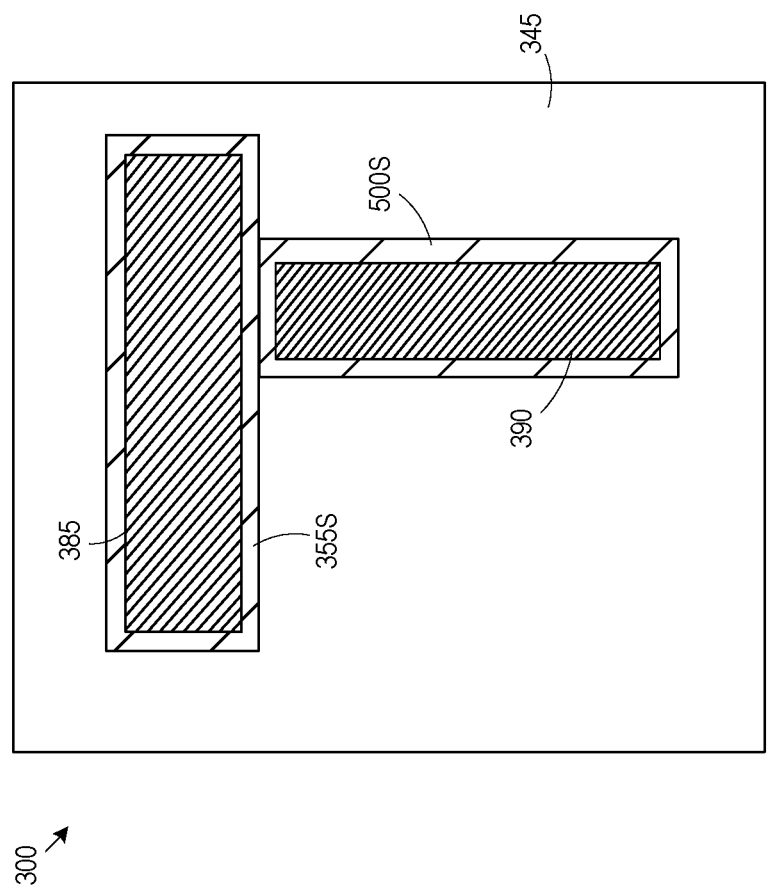

FIGS. 5A-5C illustrate an alternative process flow for forming a spacer in the gate contact opening 350 and the fin contact opening 375. FIG. 5A illustrates the device 300 after a stripping process was performed to remove the mask layer 365 on the device 300 illustrated in FIG. 3F and after a deposition process was performed to deposit a spacer layer 500 to line the fin contact opening 375.

FIG. 5B illustrates the device 300 after an anisotropic etch process was performed on the spacer layer 500 to define a sidewall spacer 500S on sidewalls of the fin contact opening 375. At this point in the process flow, the processes of FIGS. 3G-3L may be performed to define the conductive contact structures 385, 390.

FIG. 5C illustrates a plan view of the device 300. The spacer 500S provides an additional self-aligned offset between the conductive contact structures 385, 390 thereby preventing shorts. The spacing between the conductive contact structures 385, 390 may be controlled by controlling the respective widths of the spacers 355S, 500S. The spacers 355S, 500S contact one another (i.e., at least near the top surface of the dielectric layer 345) in a region where the conductive contact structure 385 overlaps the conductive contact structure 390.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A semiconductor device, comprising:
   a substrate;
   a source/drain region defined in said substrate;
   a conductive gate structure;
   a dielectric layer disposed above said source/drain region and said conductive gate structure;
   a first conductive contact positioned in said dielectric layer that conductively contacts said conductive gate structure, wherein a first dielectric spacer is disposed on all sidewalls of said first conductive contact; and
   a second conductive contact positioned in said dielectric layer that conductively contacts said source/drain region, wherein said first dielectric spacer at least partially defines a spacing between said first conductive contact and said second conductive contact.

2. The device of claim 1, further comprising a second dielectric spacer defined on a sidewall of said second conductive contact, wherein said first dielectric spacer and said second dielectric spacer define said spacing between said first conductive contact and said second conductive contact.

3. The device of claim 1, wherein said gate structure comprises a metal gate electrode.

4. The device of claim 1, further comprising epitaxial material disposed on a top portion of said source/drain region, wherein said second conductive contact contacts said epitaxial material.

5. The device of claim 1, wherein said first dielectric spacer is positioned on all sidewalls of said first conductive contact and said first dielectric spacer surrounds said first conductive contact.

6. The device of claim 2, wherein said first dielectric spacer is positioned on all sidewalls of said first conductive contact and said first dielectric spacer surrounds said first conductive contact and wherein said second dielectric spacer is positioned on all sidewalls of said second conductive contact and said second dielectric spacer surrounds said second conductive contact.

7. The device of claim 6, wherein a portion of said first dielectric spacer contacts a portion of said second dielectric spacer.

8. The device of claim 1, wherein said first dielectric spacer contacts both said first conductive contact and said second conductive contact.

9. The device of claim 1, wherein said first dielectric spacer contacts said first conductive contact and said second dielectric spacer but does not contact said second conductive contact, and said second dielectric spacer contacts said second conductive contact and said first dielectric spacer but does not contact said first conductive contact.

10. The device of claim 1, wherein said first dielectric spacer comprises a material that is different from and may be selectively etched relative to said dielectric layer.

11. The device of claim 1, wherein said first conductive contact comprises a first long axis and said second conductive contact comprises a second long axis and wherein said first long axis and said second long axis are oriented orthogonally to one another.

12. A semiconductor device, comprising:
    a substrate;
    a source/drain region defined in said substrate;
    a conductive gate structure;
    a dielectric layer disposed above said source/drain region and said conductive gate structure;
    a first conductive contact positioned in said dielectric layer that conductively contacts said conductive gate structure;
    a first dielectric spacer positioned on all sidewalls of said first conductive contact; and
    a second conductive contact positioned in said dielectric layer that conductively contacts said source/drain region, wherein said first dielectric spacer physically contacts both said first conductive contact and said second conductive contact.

13. The device of claim 12, further comprising epitaxial material disposed on a top portion of said source/drain region, wherein said second conductive contact conductively contacts said epitaxial material.

14. The device of claim 12, wherein said first dielectric spacer surrounds said first conductive contact.

15. The device of claim 12, wherein said first conductive contact comprises a first long axis and said second conductive contact comprises a second long axis and wherein said first long axis and said second long axis are oriented orthogonally to one another.

16. A semiconductor device, comprising:
    a substrate;
    a source/drain region defined in said substrate;
    a conductive gate structure;
    a dielectric layer disposed above said source/drain region and said conductive gate structure;
    a first conductive contact positioned in said dielectric layer that conductively contacts said conductive gate structure;
    a first dielectric spacer that is disposed on all sidewalls of said first conductive contact;
    a second conductive contact positioned in said dielectric layer that conductively contacts said source/drain region; and
    a second dielectric spacer that is disposed on all sidewalls of said second conductive contact, wherein said first dielectric spacer and said second dielectric spacer, collectively, at least partially define a spacing between said first conductive contact and said second conductive contact.

17. The device of claim 16, wherein said first dielectric spacer surrounds said first conductive contact and said second dielectric spacer surrounds said second conductive contact.

18. The device of claim 16, wherein said first dielectric spacer contacts said first conductive contact and said second dielectric spacer but does not contact said second conductive contact, and said second dielectric spacer contacts said second conductive contact and said first dielectric spacer but does not contact said first conductive contact.

19. The device of claim 16, wherein said first conductive contact comprises a first long axis and said second conductive contact comprises a second long axis and wherein said first long axis and said second long axis are oriented orthogonally to one another.

* * * * *